United States Patent
Ishii et al.

(10) Patent No.: US 8,598,618 B2
(45) Date of Patent: Dec. 3, 2013

(54) WHITE LIGHT EMITTING DEVICE, BACKLIGHT, LIQUID CRYSTAL DISPLAY DEVICE, AND ILLUMINATING DEVICE

(75) Inventors: Tsutomu Ishii, Yokohama (JP); Hajime Takeuchi, Yokohama (JP); Ryo Sakai, Yokohama (JP); Yasumasa Ooya, Chigasaki (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 259 days.

(21) Appl. No.: 12/988,330

(22) PCT Filed: Apr. 15, 2009

(86) PCT No.: PCT/JP2009/057561
§ 371 (c)(1),
(2), (4) Date: Oct. 18, 2010

(87) PCT Pub. No.: WO2009/128468
PCT Pub. Date: Oct. 22, 2009

(65) Prior Publication Data
US 2011/0031523 A1    Feb. 10, 2011

(30) Foreign Application Priority Data

Apr. 17, 2008    (JP) .................. 2008-107973

(51) Int. Cl.
*H01L 33/00* (2010.01)
(52) U.S. Cl.
USPC .................. 257/100; 257/E33.061
(58) Field of Classification Search
USPC .................. 313/503; 257/10, 100
See application file for complete search history.

(56) References Cited

U.S. PATENT DOCUMENTS

| 7,391,060 B2 | 6/2008 | Oshio |
| 2005/0211991 A1 | 9/2005 | Mori et al. |

(Continued)

FOREIGN PATENT DOCUMENTS

| CN | 1905228 A | 1/2007 |
| EP | 1 911 826 A1 | 4/2008 |

(Continued)

OTHER PUBLICATIONS

Office Action issued Jan. 16, 2012, in Korean Patent Application No. 10-2010-7023143.

(Continued)

*Primary Examiner* — Michael Lebentritt
*Assistant Examiner* — Aaron Dehne
(74) *Attorney, Agent, or Firm* — Oblon, Spivak, McClelland, Maier & Neustadt, L.L.P.

(57) ABSTRACT

A white light emitting device includes a blue light emitting diode chip that emits blue light in a specific wavelength band, a first resin layer that seals the blue light emitting diode chip and includes a cured product of silicone resin, and a second resin layer that covers the first resin layer and includes phosphor powder, which absorbs the blue light and emits light in a specific wavelength band, and a cured product of transparent resin. The phosphor powder has a composition represented by the following Formula (1):

$$(Sr_{1-x-y}Ba_xEu_y)_2SiO_4 \qquad (1)$$

(in Formula (1), x and y satisfy a condition that $0.05<x<0.5$ and $0.05<y<0.3$.) The first resin layer has thickness within a range of 200 μm to 2000 μm. The white light emitting device has high luminance for a long period.

9 Claims, 1 Drawing Sheet

(56) References Cited

U.S. PATENT DOCUMENTS

| | | |
|---|---|---|
| 2005/0227569 A1* | 10/2005 | Maeda et al. ............... 445/25 |
| 2006/0226774 A1* | 10/2006 | Sofue et al. ............... 313/512 |
| 2007/0090381 A1 | 4/2007 | Otsuka et al. |
| 2007/0096113 A1 | 5/2007 | Inoshita et al. |
| 2007/0259206 A1 | 11/2007 | Oshio |
| 2007/0287208 A1 | 12/2007 | Thompson et al. |

FOREIGN PATENT DOCUMENTS

| | | |
|---|---|---|
| JP | 10 190065 | 7/1998 |
| JP | 2005 191197 | 7/2005 |
| JP | 2006 49799 | 2/2006 |
| JP | 2007 103494 | 4/2007 |
| JP | 2007 116131 | 5/2007 |
| WO | WO 2007129847 A1 * | 11/2007 |
| WO | 2008 041519 | 4/2008 |
| WO | WO 2008/038691 A1 | 4/2008 |

OTHER PUBLICATIONS

International Preliminary Report on Patentability with Written Opinion issued Nov. 30, 2010 in PCT/JP2009/057561.
International Search Report issued May 19, 2009 in PCT/JP09/57561 filed Apr. 15, 2009.
Office Action issued Mar. 16, 2012 in Chinese Patent Application No. 200980113693.2 (with English translation).
Office Action issued Aug. 29, 2012 in Chinese Patent Application No. 200980113693.2 (with English translation).

* cited by examiner

WHITE LIGHT EMITTING DEVICE, BACKLIGHT, LIQUID CRYSTAL DISPLAY DEVICE, AND ILLUMINATING DEVICE

TECHNICAL FIELD

The present invention relates to a technique for emitting white light by using a blue light emitting diode and a resin layer including phosphor powder that absorbs blue emitted light of the blue light emitting diode and performs light emission of blue-green to yellow light, and more particularly to a white light emitting device that emits white light, and a backlight, a liquid crystal display device, and an illuminating device including the white light emitting device.

BACKGROUND ART

A light emitting diode (LED) is a semiconductor diode that radiates light. The light emitting diode converts electric energy into ultraviolet light or visible light.

Conventionally, LED lamps including light emitting diodes are widely used.

For example, when a light emitting chip is formed by using a substrate such as a transparent substrate and a light emitting material such as GaP, GaAsP, GaAlAs, GaN, or InGaAlP and sealed by transparent resin, an LED lamp that radiates visible light is obtained. When the light emitting material is fixed on an upper surface of a printed board or a metal lead and sealed by a resin case molded to a number or a character, an LED lamp of a display type that radiates visible light is obtained.

A replacement frequency of the LED lamp is reduced and extension of life thereof is possible because the light emitting diode as a semiconductor element having long life and high reliability is used. Therefore, LED lamps are widely used as components of display devices of a portable communication apparatus, a personal computer peripheral apparatus, an OA apparatus, a home appliance, audio equipment, vehicles such as an automobile, a signal light, a switch, a light source display plate for backlight, and the like.

If various kinds of phosphor powder are included in a front surface of the light emitting chip, the sealing resin, or the resin case, the LED lamp can adjust a color of radiated light. Specifically, if the light emitting chip and the phosphor powder that absorbs light radiated from the light emitting chip and emits light in a predetermined wavelength band are used in combination, it is possible to cause the LED lamp to emit light in a visible light domain and white light corresponding to applications according to an action of the light radiated from the light emitting chip and the light radiated from the phosphor powder.

Among the LED lamps, in particular, a white light emitting LED lamp is currently increasingly used in a backlight of a cellular phone and a vehicle-mounted lamp. In future, it is expected that the white light emitting LED lamp substantially grows as a substitute for a fluorescent lamp. For example, a RoHS regulation (a harmful chemical substance regulation) of EU prohibits use of mercury. Therefore, it is predicted that the white light emitting LED lamp that does not use mercury replaces the conventional fluorescent lamp that uses mercury.

As the white light emitting LED lamp, for example, a white light emitting LED lamp of a type obtained by combining a blue light emitting diode chip and a yellow light emitting phosphor (YAG) and further combining a red phosphor if necessary (hereinafter referred to as "type 1 of the white light emitting LED lamp") and a white light emitting LED lamp of a type obtained by combining an ultraviolet ray or violet light emitting diode chip and blue, yellow, and red phosphors (hereinafter referred to as "type 2 of the white light emitting LED lamp") are currently used or studied.

Among these white light emitting LED lamps, the type 1 of the white light emitting LED lamp is preferred and used because the type 1 has higher luminance than the type 2.

As a material of the yellow phosphor used in the type 1 of the white light emitting LED lamp, a cerium activated yttrium aluminate phosphor (YAG), a cerium activated terbium aluminate phosphor (TAG), an alkali earth silicate phosphor, and the like are known.

Among these materials, the YAG and the alkali earth silicate phosphor are already used in a fluorescent lamp for a backlight of a cellular phone, a flying spot scanner, and the like. However, there is a problem in that luminance of the YAG and the alkali earth silicate phosphor is insufficient for used in illumination, a headlamp of a car, and the like.

In recent years, since color perception of users is improved, the LED lamp is required to have high-definition reproducibility of a subtle tone and uniformity of an external appearance.

In response to the request, various proposals have been made to increase luminance and to give high color rendering properties and the uniformity of an external appearance to the white light emitting LED lamp.

For example, Patent Document 1 (International publication No. 2003/021691) discloses a white light emitting LED lamp including the alkali earth silicate phosphor and having a high luminous flux. This white light emitting LED lamp has a high luminous flux equivalent to that of the white light emitting LED lamp including the YAG and has little color unevenness.
Patent Document 1: International Publication No. 2003/021691

DISCLOSURE OF THE INVENTION

Problems to be Solved by the Invention

However, the alkali earth silicate phosphor has a problem in that the alkali earth silicate phosphor is inferior in luminance to the aluminate phosphors such as the YAG and the TAG and has a large fall in luminance when temperature rises.

The present invention has been devised in view of the circumstances and it is an object of the present invention to provide a white light emitting device obtained by combining the blue light emitting diode chip and the alkali earth silicate phosphor and having high luminance for a long period, and a backlight, a liquid crystal display device, and an illuminating device including the white light emitting device.

Means for Solving the Problems

A white light emitting device according to the present invention solves the problems. The white light emitting device includes a blue light emitting diode chip that emits blue light having a light emission peak wavelength of 430 nm to 490 nm, a first resin layer that seals the blue light emitting diode chip and includes a cured product of silicone resin, and a second resin layer that covers the first resin layer and includes phosphor powder, which absorbs the blue light and emits light having a light emission peak wavelength of 500 nm to 570 nm, and a cured product of transparent resin. The phosphor powder has a composition represented by the following Formula (1):

$$(Sr_{1-x-y}Ba_xEu_y)_2SiO_4 \qquad (1)$$

(in Formula (1), x and y satisfy a condition $0.05<x<0.5$ and $0.05<y<0.3$.)

The first resin layer has a thickness within a range of 200 μm to 2000 μm. The thickness is a length of a portion present in the first resin layer in a segment connecting a center portion of a bottom surface of the blue light emitting diode chip and a surface of the second resin layer.

The backlight according to the present invention solves the problems. In the backlight, the white light emitting device is used as a light source.

The liquid crystal display device according to the present invention solves the problems. The liquid crystal display device includes the backlight.

The illuminating device according to the present invention solves the problems. In the illuminating device, the white light emitting device is used as a light source.

Advantageous Effects of the Invention

The light emitting device according to the present invention has high luminance for a long period.

The backlight according to the present invention has high luminance for a long period.

The liquid crystal display device according to the present invention has high luminance for a long period.

The illuminating device according to the present invention has high luminance for a long period.

Figure 1:
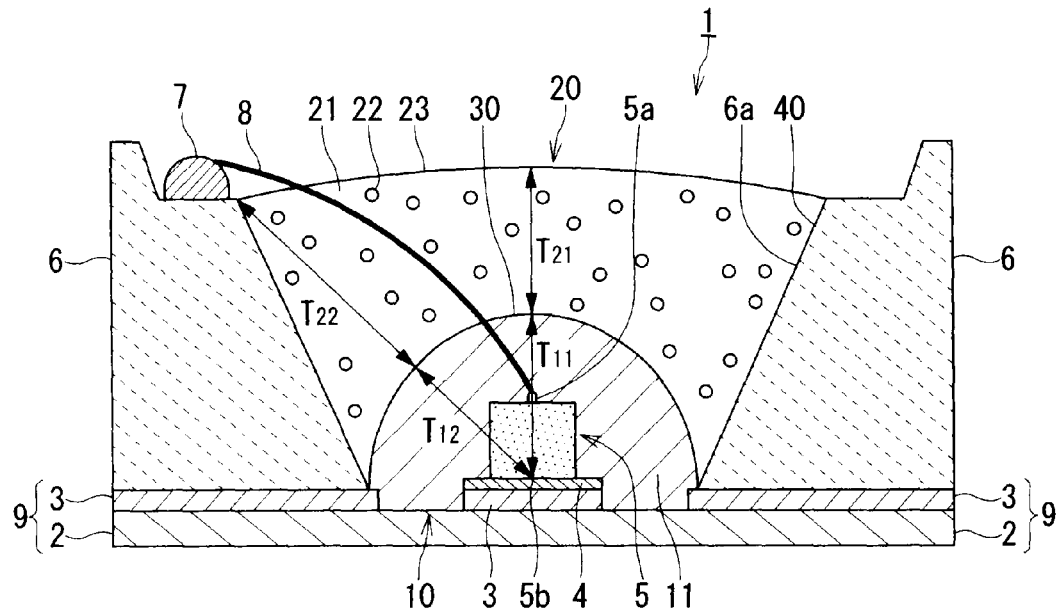
FIG. 1 is a sectional view of a first embodiment of a white light emitting device according to the present invention.

DESCRIPTION OF SYMBOLS 1, 1A LED lamps (white light emitting devices)
2 substrate
3 conductive layer
4 sub-mount substrate (AlN substrate)
5 light emitting diode chip (LED chip)
5a top portion of the light emitting diode chip
5b center of a bottom portion of the light emitting diode chip
6 frame portion
6a reflecting surface of the frame portion
7 electrode portion
8 bonding wire
9 printed wiring board
10, 10A silicone resin layers (first resin layers)
11 cured product of silicone resin
20, 20A phosphor layers (second resin layers)
21 cured product of transparent resin
22 phosphor particles (phosphor powder)
23 surface of a phosphor layer
30, 30A interfaces between the silicone resin layers and phosphor layers (surfaces of the silicone resin layers)
40 recessed portion
$T_{11}, T_{12}, T_{13}, T_{14}$ thicknesses of the silicone resin layers
$T_{21}, T_{22}, T_{23}, T_{24}$ thicknesses of the phosphor layers

BEST MODE FOR CARRYING OUT THE INVENTION

<White Light Emitting Device>

First Embodiment

FIG. 1 is a sectional view of a first embodiment of a white light emitting device according to the present invention. As shown in FIG. 1, a white light emitting device 1 includes a blue light emitting diode chip 5 mounted on a printed wiring board 9, a first resin layer 10 that seals the blue light emitting diode chip 5 and includes a cured product 11 of silicone resin, and a second resin layer 20 that covers the first resin layer 10 and includes phosphor powder 22 and a cured product of transparent resin 21.

(Printed Wiring Board)

The printed wiring board 9 includes a substrate 2 and a conductive layer 3 provided on a surface of the substrate 2 or the like. As the substrate 2, for example, a glass epoxy resin substrate or a ceramic substrate is used. As the conductive layer 3, for example, a circuit of copper formed of etching or the like of a copper foil is used.

A frame portion 6 is provided on an upper side in the figure of the printed wiring board 9. The frame portion 6 is formed such that a shape of a recessed portion 40 formed by being surrounded by the printed wiring board 9 and the frame portion 6 is a conical trapezoidal shape expanded in diameter further away from the printed wiring board 9. As the shape of the recessed portion 40, a shape other than the conical trapezoidal shape, for example, various shapes such as a columnar shape and a square pole shape can be adopted. However, the recessed portion 40 desirably has the conical trapezoidal shape because a light emitting surface is wide. As a material of the frame portion 6, for example, plastic, ceramic such as AlN, or a Cu plate is used. When metal such as the Cu plate is used as the frame portion 6, usually, an insulative film is provided on a surface.

A wall surface 6a of the frame portion 6 is formed as a reflecting surface that reflects light radiated from the blue light emitting diode chip 5 and the phosphor powder 22. The reflecting surface is obtained by a publicly-known method such as plating by metal.

(Blue Light Emitting Diode Chip)

The blue light emitting diode chip 5 is a light emitting diode chip that emits blue light having a light emission peak wavelength of 430 nm to 490 nm. As the blue light emitting diode chip 5, for example, a diode chip obtained by laminating a layer of semiconductor on a surface of a not-shown transparent substrate such as a sapphire substrate or an SiC substrate is used. As the semiconductor, for example, a gallium nitride compound semiconductor such as InGaN, a zinc selenide semiconductor such as ZnCdSe, a zinc oxide semiconductor such as ZnO, or the like is used.

The blue light emitting diode chip 5 may be arranged such that the transparent substrate faces the printed wiring board 9 or may be arranged such that a surface on an opposite side of the transparent substrate faces the printed wiring board 9.

As the blue light emitting diode chip 5, a high-power diode chip having peak forward current equal to or larger than 100 mA can also be used. Since the blue light emitting diode chip 5 having large peak forward current has a large heat value, in the conventional white light emitting device that seals the blue light emitting diode chip 5 with a resin layer including phosphor powder, the phosphor powder tends to be deteriorated by heat. On the other hand, in the white light emitting device 1 according to the present invention, the first resin layer (a silicone resin layer) 10 not including the phosphor powder 22 is provided between the blue light emitting diode chip 5 and the second resin layer 20 including the phosphor powder 22. Therefore, the phosphor powder 22 is not directly exposed to high heat and is less easily deteriorated.

The blue light emitting diode chip 5 is mounted on the printed wiring board 9 via a sub-mount substrate 4 on a bottom portion of a recessed portion of a conical trapezoidal shape formed by being surrounded by the printed wiring board 9 and the frame portion 6. The sub-mount substrate 4 is used not to directly transmit generated heat from the blue light emitting diode chip 5 to the printed wiring board 9 and the like. The sub-mount substrate 4 is formed of a substance having high thermal conductivity such as AlN.

The blue light emitting diode chip 5 is electrically connected to the sub-mount substrate 4 by a not-shown lead, a solder ball, or the like. The sub-mount substrate 4 is electrically connected to the conductive layer 3 by a not-shown lead, a solder ball, or the like.

A top portion 5a of the blue light emitting diode chip 5 is electrically connected to an electrode portion 7, which is provided at a top portion of the frame portion 6, by a bonding wire 8 made of gold.

(First Resin Layer)

The first resin layer (the silicone resin layer) 10 is formed of the cured product 11 of silicone resin and seals the blue light emitting diode chip 5. Examples of silicone resin used for formation of the first resin layer 10 include publicly-known silicone resin. The first resin layer 10 can be cured by heating the silicone resin to, for example, 100° C. to 160° C.

As shown in FIG. 1, an interface 30 between the first resin layer 10 and the second resin layer (a phosphor layer) 20 is formed in a dome shape. Examples of a method of forming the interface 30 of the first resin layer 10 in a dome shape include a method of using silicone resin having high viscosity, forming a dome shape with surface tension of the silicone resin and directly curing the silicone resin, a method of pressing a die of a dome shape against the silicone resin and curing the silicone resin, and a method of allowing silicone resin to flow down and curing the silicone resin alternately so as to form the silicone resin in a dome shape.

Thickness of the first resin layer 10, which is length of a portion present in the first resin layer 10 in a segment connecting a center portion 5b of a bottom surface of the blue light emitting diode chip 5 and a surface of the second resin layer 20, is usually within a range of 200 μm to 2000 μm and desirably within a range of 500 μm to 1000 μm.

The bottom surface of the blue light emitting diode chip 5 means a surface of the blue light emitting diode chip 5 facing the printed wiring board 9. The center portion 5b of the bottom surface means a center of gravity of the bottom surface.

The thickness of the first resin layer 10 is indicated by, for example, reference signs $T_{11}$ and $T_{12}$ in FIG. 1. Each of the $T_{11}$ and $T_{12}$ is within the numerical value range. In other words, a distance from the center portion 5b of the bottom surface to the second resin layer 20 is usually within the range of 200 μm to 2000 μm.

(Second Resin Layer)

The second resin layer (the phosphor layer) 20 includes the phosphor powder 22 that absorbs blue light having a light emission peak wavelength of 430 nm to 490 nm radiated by the blue light emitting diode chip 5 and emits light having a light emission peak wavelength of 500 nm to 570 nm and the cured product of transparent resin 21. The second resin layer 20 covers the first resin layer 10. In the second resin layer 20, the phosphor powder 22 is desirably uniformly dispersed in the cured product of transparent resin 21.

The phosphor powder 22 has a composition represented by the following Formula (1):

$$(Sr_{1-x-y}Ba_xEu_y)_2SiO_4 \qquad (1)$$

In Formula (1), x and y usually satisfy a condition that $0.05<x<0.5$ and $0.05<y<0.3$, desirably satisfy a condition that $0.05<x<0.15$ and $0.1<y<0.15$, and more desirably satisfy a condition that $0.35 \leq x \leq 0.45$ and $0.1 \leq y \leq 0.15$.

x and y in Formula (1) desirably satisfy the latter condition because the phosphor powder 22 has higher luminance.

An average particle diameter of the phosphor powder 22 is usually within a range of 30 μm to 80 μm and desirably within a range of 40 μm to 60 μm. The average particle diameter means $D_{50}$ indicating a particle diameter at a weight accumulated value of 50%.

The average particle diameter $D_{50}$ of the phosphor powder 22 smaller than 30 μm is undesirable because light scatters on the phosphor powder 22, it is difficult to effectively use the light, and luminance falls. The average particle diameter $D_{50}$ of the phosphor powder 22 exceeding 80 μm is undesirable because the composition of the phosphor powder 22 is non-uniform and light emission performance tends to fall.

The phosphor powder 22 is obtained by mixing an Sr contained material such as $SrCO_3$, a Ba contained material such as $BaCO_3$, an Eu contained material such as $Eu_2O_3$, and an Si contained material such as $SiO_2$ at a predetermined compounding ratio, sintering a mixed product, and classifying a sintered product. The material powders desirably have an average particle diameter of 1 to 15 μm. Reaction can be uniformly caused by using fine material powder having an average particle diameter equal to or smaller than 15 μm.

The sintering of the mixed product is performed by, for example, processing the mixed product for two hours to ten hours at 1100° C. to 1600° C. under a reducing atmosphere of, for example, nitrogen containing hydrogen.

The phosphor powder 22 can be obtained by grinding, elutriating, and drying the sintered product as appropriate.

Examples of the transparent resin used for the formation of the second resin layer 20 include epoxy resin and silicone resin.

The second resin layer 20 is manufactured by, for example, mixing the transparent resin and the phosphor powder, preparing second resin layer slurry in which the phosphor powder is dispersed in the transparent resin, and allowing the second resin layer slurry to flow down on the first resin layer 10 and curing the second resin layer slurry.

Slurry concentration of the second resin layer slurry is usually 10 weight % to 50 weight %. The slurry concentration in this range is desirable because a phosphor is uniformly dispersed. In the present invention, the blue light emitting diode is used. Blue light from the light emitting diode is uniformly transmitted through the second resin layer, whereby clear white emitted light is obtained. If the phosphor is non-uniformly dispersed, it is difficult to obtain a clear white color light.

The second resin layer slurry can be cured by being heated to, for example, 100° C. to 160° C.

Thickness of the second resin layer 20, which is length of a portion present in the second resin layer 20 in a segment connecting the center portion 5b of the bottom surface of the blue light emitting diode chip 5 and the surface of the second resin layer 20, is usually within a range of 1000 μm to 5000 μm and desirably within a range of 2000 μm to 3500 μm. When the thickness of the second resin layer is smaller than 1000 μm, an amount of the phosphor is small and it is difficult to adjust a color. On the other hand, when the thickness of the second resin layer exceeds 5000 μm, a more effect is not obtained and, moreover, it is difficult to transmit light from the light emitting diode through the second resin layer.

The bottom surface of the blue light emitting diode chip 5 means a surface of the blue light emitting diode chip 5 facing the printed wiring board 9. The center portion 5b of the bottom surface means a center of gravity of the bottom surface.

The thickness of the second resin layer 20 is indicated by, for example, reference signs $T_{21}$ and $T_{22}$ in FIG. 1. Each of $T_{21}$ and $T_{22}$ is within the numerical value range.

(Operation)

Operation of the white light emitting device 1 is explained.

The blue light emitting diode chip 5 radiates blue light according to energization or the like. The blue light radiated from the blue light emitting diode chip 5 transmits through the silicone resin layer 10 and then reaches the phosphor layer 20. The phosphor powder 22 included in the phosphor layer 20 receives the light radiated from the light emitting diode chip 5 and radiates yellow to blue-green light.

The blue light radiated from the blue light emitting diode chip 5 and the light yellow to blue-green light radiated from the phosphor powder 22 are led to a surface 23 of the phosphor layer directly or while being reflected on a reflecting surface 6a of the frame portion. Light radiated from the surface 23 of the phosphor layer to the outside is substantially white according to an action of the blue light and the yellow to blue-green light.

Since the light emitting diode chip 5 generates heat in light emission, the silicone resin layer 10 around the light emitting diode chip 5 is heated. However, since the phosphor powder 22 that is tend to be deteriorated by high temperature and to have low luminance is not included in the silicone resin layer 10, the luminance of the white light emitting device 1 less easily falls even if the white light emitting device 1 is used for a long period.

With the white light emitting device 1, the first resin layer 10 not including the phosphor powder 22 is provided between the blue light emitting diode chip 5 and the second resin layer including the phosphor powder 22. Light emission performance of the phosphor powder 22 that tends to be deteriorated by heat generation of the blue light emitting diode chip 5 less easily falls. Therefore, it is possible to maintain high luminance for a long period.

With the white light emitting device 1, the interface 30 between the first resin layer 10 and the second resin layer 20 is formed in a dome shape. Therefore, a forming range of the first resin layer 10 can be limited to an area around the blue light emitting diode chip 5 in a degree for less easily causing deterioration in the phosphor powder 22. A forming range of the second resin layer 20 can be relatively increased. Consequently, the luminance of the white light emitting device 1 less easily falls even if the first resin layer 10 is provided. The white light emitting device 1 is less easily increased in size because luminance fall is supplemented.

Second Embodiment

Figure 2:
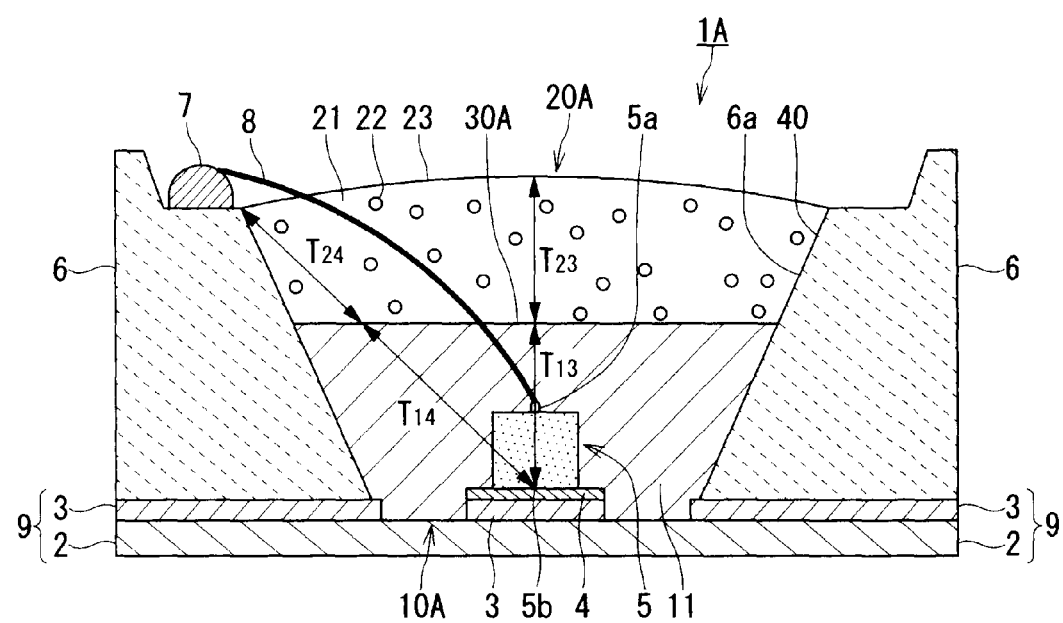
FIG. 2 is a sectional view of a second embodiment of the white light emitting device according to the present invention.

FIG. 2 is a sectional view of a second embodiment of the white light emitting device according to the present invention. A white light emitting device 1A according to the second embodiment shown in FIG. 2 is different from the white light emitting device 1 according to the first embodiment shown in FIG. 1 only in that a first resin layer 10A is formed instead of the first resin layer 10 and a second resin layer 20A is formed instead of the second resin layer 20.

Therefore, only the differences between the white light emitting device 1A according to the second embodiment and the white light emitting device 1 according to the first embodiment are explained below. The same components of the white light emitting device 1A and the white light emitting device 1 are denoted by the same reference numerals and signs and explanation of the components is omitted or simplified.

(First Resin Layer)

The first resin layer 10A is different in that, whereas the interface 30 between the first resin layer 10 and the second resin layer (the phosphor layer) 20 is formed in a dome shape, an interface 30A between the first resin layer 10A and the second resin layer (a phosphor layer) 20A is formed in a flat shape.

Examples of a method of forming the interface 30A between the first resin layer 10A and the second resin layer 20A in a flat shape includes a method of allowing silicone resin having low viscosity to flow down and curing the silicone resin.

Thickness of the first resin layer 10A, which is length of a portion present in the first resin layer 10A in a segment connecting the center portion 5b of the bottom surface of the blue light emitting diode chip 5 and a surface of the second resin layer 20A, is usually within a range of 200 µm to 2000 µm and desirably within a range of 500 µm to 1000 µm.

The thickness of the first resin layer 10A is indicated by, for example, reference signs $T_{13}$ and $T_{14}$ in FIG. 2. Each of the $T_{13}$ and $T_{14}$ is within the numerical value range. This means that a distance from the center portion 5b of the bottom surface to the second resin layer 20A is usually within the range of 200 µm to 2000 µm.

(Second Resin Layer)

The second resin layer 20A is different in that, whereas the interface 30 between the second resin layer 20 and the first resin layer 10 is formed in a dome shape, the interface 30A between the second resin layer 20A and the first resin layer 10A is formed in a flat shape.

Thickness of the second resin layer 20A, which is length of a portion present in the second resin layer 20A in a segment connecting the center portion 5b of the bottom surface of the blue light emitting diode chip 5 and the surface of the second resin layer 20A, is usually within a range of 1000 µm to 5000 µm and desirably within a range of 2000 µm to 3500 µm.

The thickness of the second resin layer 20A is indicated by, for example, reference signs $T_{23}$ and $T_{24}$ in FIG. 2. Each of $T_{23}$ and $T_{24}$ is within the numerical value range.

(Operation)

Operation of the white light emitting device 1A is explained.

Operation of the white light emitting device 1A is different from the operation of the white light emitting device 1 only in the operation based on a difference in a configuration between the silicone resin layer 10A and the silicone resin layer 10. The other components are the same in the white light emitting device 1A and the white light emitting device 1. Therefore, explanation concerning common points of the operations of both the white light emitting devices is omitted and only the difference is explained.

Since the interface 30A between the phosphor layer 20A and the silicone resin layer 10A of the white light emitting device 1A is formed in a flat shape, it is easier to form the silicone resin layer 10A than the silicone resin layer 10 of the white light emitting device 1 in which the interface 30 with the phosphor layer 20 is formed in a dome shape. Specifically, the silicone resin layer 10A can be obtained by simply allowing silicone resin to flow down onto the blue light emitting diode chip 5 in the recessed portion 40 and curing the silicone resin. Therefore, it is unnecessary to increase viscosity of the silicone resin or mold the silicone resin in a dome shape after flowing down unlike the silicone resin layer 10 of the white light emitting device 1. It is easy to form the silicone resin layer 10A.

With the white light emitting device 1A, the first resin layer 10A not including the phosphor powder 22 is provided between the blue light emitting diode chip 5 and the second resin layer 20A including the phosphor powder 22. Light emission performance of the phosphor powder 22 that tends to be deteriorated by heat generation of the blue light emitting diode chip 5 less easily falls. Therefore, it is possible to maintain high luminance for a long period.

With the white light emitting device 1A, since the interface 30A between the first resin layer 10A and the second resin layer 20A is formed in a flat shape, it is easy to form the first resin layer 10A.

<Backlight>

In the backlight according to the present invention, the white light emitting device is used as a light source.

The backlight according to the present invention can be configured to include a light source unit manufactured by linearly arranging a plurality of the white light emitting devices laterally and a light guide plate that receives substantially strip-like light radiated from the light source unit on a side and emits the light from a front.

With the backlight according to the present invention, since the white light emitting device is used as the light source, it is possible to maintain high luminance for a long period.

<Liquid Crystal Display Device>

The liquid crystal display device according to the present invention includes the backlight.

The liquid crystal display device according to the present invention can be configured by incorporating the backlight in a liquid crystal display.

With the liquid crystal display device according to the present invention, since the white light emitting device is used as the light source in the backlight, it is possible to maintain high luminance for a long period.

<Illuminating Device>

In the illuminating device according to the present invention, the white light emitting device is used as a light source.

The illuminating device according to the present invention can be configured by arraying a plurality of the white light emitting devices linearly, in a lattice shape, or radially or combining the linear array, the array in the lattice shape, and the radial array of the white light emitting devices.

With the illuminating device according to the present invention, since the white light emitting device is used as the light source, it is possible to maintain high luminance for a long period.

EXAMPLES

Examples are explained below. However, the present invention is not interpreted to be limited to the examples.

Example 1

The LED lamp 1 shown in FIG. 1 was manufactured according to a procedure explained below.

(Preparation of Phosphor Powder)

$SrCO_3$ powder (an average particle diameter 6 μm), $BaCO_3$ powder (an average particle diameter 10 μm), $Eu_2O_3$ powder (an average particle diameter 8 μm), and $SiO_2$ powder (an average particle diameter 4 μm) were mixed at a predetermined molar ratio. An obtained mixed product was stored in an alumina crucible and sintered for five hours at 1300° C. in a reducing atmosphere including 90 volume % of $N_2$ and 10 volume % of $H_2$. A composition of a sintered product was analyzed by an X-ray powder diffraction instrument. The sintered product was pulverized, washed with water, elutriated, and dried to obtain phosphor powder having a predetermined average particle diameter. The average diameter means $D_{50}$ indicating a particle diameter at a weight accumulated value of 50%.

(Mounting of a Light Emitting Diode Chip on a Printed Wiring Board)

As shown in FIG. 1, the frame portion 6 made of epoxy resin was provided on a surface on one side of the printed wiring board 9 including the insulating substrate 2 and the conductive layer 3. The frame portion 6 was formed such that a shape of a recessed portion formed to be surrounded by the printed wiring board 9 and the frame portion 6 was a conical trapezoidal shape expanded in diameter further away from the printed wiring board 9.

Subsequently, the blue light emitting diode chip 5 having size of width 1.5 mm×depth 2.0 mm×height 0.01 mm was mounted on the printed wiring board 9 via the sub-mount substrate 4 made of AlN. The transparent substrate side of the blue light emitting diode chip 5 was mounted on the sub-mount substrate 4 by using a not-shown solder ball. The sub-mount substrate 4 and the conductive layer 3 of the printed wiring board 9 were connected by soldering. Further, the top portion 5a of the blue light emitting diode chip 5 and the electrode portion 7 provided at the top portion of the frame portion 6 were electrically connected by the bonding wire 8 made of gold.

(Manufacturing of a Silicone Resin Layer)

Silicone resin was allowed to flow down as transparent resin into the recessed portion 40 having the conical trapezoidal shape surrounded by the substrate 2 and the frame portion 6 to cover the light emitting diode chip 5. The silicone resin covering the light emitting diode chip 5 was formed in a dome shape by surface tension. When the silicone resin was dried and cured at 140° C., as shown in FIG. 1, the silicone resin layer 10 formed of the silicone resin 11 cured in the dome shape was obtained.

The thickness of the silicone resin layer 10 was obtained by measuring, after the phosphor layer 20 explained later was formed, length of a portion present in the silicone resin layer 10 in a segment connecting the center 5b of the bottom portion of the light emitting diode chip 5 and the surface 23 of the phosphor layer 20.

(Manufacturing of a Phosphor Layer)

The silicone resin and the phosphor powder was mixed and a phosphor layer slurry having slurry concentration of 30 percentage of mass in which the phosphor powder was dispersed was prepared.

The phosphor layer slurry was allowed to flow down from above the silicone resin layer 10. When the phosphor layer slurry was dried and cured at 140° C., as shown in FIG. 1, the phosphor layer 20 in which particles of the phosphor powder 22 was dispersed in the cured product 21 of the silicone resin was obtained.

The thickness of the phosphor layer 20 was obtained by measuring length of a portion in the phosphor layer 20 in a segment connecting the center 5b of the bottom portion of the light emitting diode chip 5 and the surface 23 of the phosphor layer 20.

Luminance and life was measured for the LED lamp 1. A result of the measurement is shown in Table 1.

(Method of Measuring Luminance)

A light emitting diode chip was caused to emit light at 25° C. and a current value of 60 mA and luminance after ten minutes was measured by using an MCPD apparatus manufactured by Otsuka Electronics Co., Ltd.

(Method of Measuring Life)

A luminance degradation rate in continuous lighting of the LED lamp 1 for thirty days under an environment of 50° C. was measured. Specifically, in comparison with luminance after continuous lighting for ten minutes at 25° C., the luminance degradation rate was indicated by [{(luminance after continuous lighting for ten minutes at 25° C.)−(luminance after continuous lighting for thirty days at 50° C.)}/(luminance after continuous lighting for ten minutes at 25° C.)]×100(%). The temperature 50° C. was selected assuming temperature of a chip that generates heat according to continuous operation of the light emitting diode chip.

Comparative Example 1

An LED lamp was manufactured in the same manner as Example 1 except that the silicone resin layer 10 was not provided and the light emitting diode chip 5 was sealed by the phosphor layer 20. Luminance and life were measured for the obtained LED lamp in the same manner as Example 1. A result of the measurement is shown in Table 1.

Comparative Example 2

An LED lamp same as that in Example 1 except that a phosphor composition was outside the range was manufactured and measurement same as that in Example 1 was performed. Luminance and life were measured for the obtained LED lamp in the same manner as Example 1. A result of the measurement is shown in Table 1.

Comparative Examples 3 and 4

An LED lamp was manufactured in the same manner as Example 1 except that the thickness of the silicone resin layer 10 was changed. Luminance and life were measured for the obtained LED lamp in the same manner as Example 1. A result of measurement is shown in Table 1.

Examples 2 to 8

An LED lamp was manufactured in the same manner as Example 1 except that manufacturing conditions are changed as shown in Table 1. Luminance and life were measured for the obtained LED lamp in the same manner as Example 1. A result of the measurement is shown in Table 1.

Examples 9 to 13

An LED lamp was manufactured in the same manner as Example 6 except that an average particle diameter of phosphor powder was changed as shown in Table 1. Luminance and life were measured for the obtained LED lamp in the same manner as Example 1. A result of the measurement is shown in Table 1.

Examples 14 to 17

An LED lamp was manufactured in the same manner as Example 4 except that an average particle diameter of phosphor powder was changed as shown in Table 1. Luminance and life were measured for the obtained LED lamp in the same manner as Example 1. A result of the measurement is shown in Table 1.

TABLE 1

| | Chemical Composition of Phosphor Powder | Average Particle Diameter of Phosphor ($\mu m$) | Content of Phosphor Powder in Phosphor Layer (mass %) | Thicknesses of Silicone Resin Layer | | Thicknesses of Phosphor Layer | | Luminance of LED Lamp (mcd) | Luminance Degradation Rate of LED Lamp (%) |
| --- | --- | --- | --- | --- | --- | --- | --- | --- | --- |
| | | | | Minimum ($\mu m$) | Maximum ($\mu m$) | Minimum ($\mu m$) | Maximum ($\mu m$) | | |
| Example 1 | $(Sr_{0.54}Ba_{0.36}Eu_{0.1})_2SiO_4$ | 50 | 30 | 200 | 230 | 2200 | 2240 | 122 | 1 |
| Example 2 | $(Sr_{0.48}Ba_{0.4}Eu_{0.12})_2SiO_4$ | 30 | 50 | 500 | 520 | 2900 | 2970 | 127 | 1 |
| Example 3 | $(Sr_{0.48}Ba_{0.4}Eu_{0.12})_2SiO_4$ | 50 | 45 | 700 | 730 | 2100 | 2150 | 123 | 1 |
| Example 4 | $(Sr_{0.47}Ba_{0.42}Eu_{0.11})_2SiO_4$ | 80 | 20 | 980 | 1000 | 3000 | 3050 | 120 | 1 |
| Example 5 | $(Sr_{0.5}Ba_{0.4}Eu_{0.1})_2SiO_4$ | 50 | 30 | 850 | 880 | 2800 | 2880 | 128 | 1 |
| Example 6 | $(Sr_{0.54}Ba_{0.36}Eu_{0.1})_2SiO_4$ | 50 | 40 | 780 | 800 | 3200 | 3240 | 135 | 0.8 |
| Example 7 | $(Sr_{0.42}Ba_{0.43}Eu_{0.15})_2SiO_4$ | 50 | 10 | 300 | 320 | 3100 | 3150 | 120 | 3 |
| Example 8 | $(Sr_{0.5}Ba_{0.37}Eu_{0.13})_2SiO_4$ | 50 | 80 | 900 | 910 | 1700 | 1740 | 132 | 1 |
| Comparative example 1 | $(Sr_{0.54}Ba_{0.36}Eu_{0.1})_2SiO_4$ | 50 | 30 | 0 | 0 | 2200 | 2240 | 122 | 20 |
| Comparative example 2 | $(Sr_{0.1}Ba_{0.8}Eu_{0.1})_2SiO_4$ | 50 | 30 | 200 | 230 | 2200 | 2240 | 105 | 3 |
| Comparative example 3 | $(Sr_{0.54}Ba_{0.36}Eu_{0.1})_2SiO_4$ | 50 | 30 | 100 | 100 | 2200 | 2240 | 122 | 10 |
| Comparative example 4 | $(Sr_{0.54}Ba_{0.36}Eu_{0.1})_2SiO_4$ | 50 | 30 | 3000 | 3000 | 2200 | 2240 | 112 | 0.7 |
| Example 9 | $(Sr_{0.54}Ba_{0.36}Eu_{0.1})_2SiO_4$ | 60 | 40 | 780 | 800 | 3200 | 3240 | 135 | 0.8 |
| Example 10 | $(Sr_{0.54}Ba_{0.36}Eu_{0.1})_2SiO_4$ | 40 | 40 | 780 | 800 | 3200 | 3240 | 135 | 0.8 |
| Example 11 | $(Sr_{0.54}Ba_{0.36}Eu_{0.1})_2SiO_4$ | 30 | 40 | 780 | 800 | 3200 | 3240 | 125 | 0.8 |
| Example 12 | $(Sr_{0.54}Ba_{0.36}Eu_{0.1})_2SiO_4$ | 100 | 40 | 780 | 800 | 3200 | 3240 | 115 | 0.8 |
| Example 13 | $(Sr_{0.54}Ba_{0.36}Eu_{0.1})_2SiO_4$ | 20 | 40 | 780 | 800 | 3200 | 3240 | 120 | 0.8 |
| Example 14 | $(Sr_{0.47}Ba_{0.42}Eu_{0.11})_2SiO_4$ | 60 | 20 | 980 | 1000 | 3000 | 3050 | 125 | 1 |
| Example 15 | $(Sr_{0.47}Ba_{0.42}Eu_{0.11})_2SiO_4$ | 40 | 20 | 980 | 1000 | 3000 | 3050 | 125 | 1 |
| Example 16 | $(Sr_{0.47}Ba_{0.42}Eu_{0.11})_2SiO_4$ | 100 | 20 | 980 | 1000 | 3000 | 3050 | 110 | 1 |
| Example 17 | $(Sr_{0.47}Ba_{0.42}Eu_{0.11})_2SiO_4$ | 20 | 20 | 980 | 1000 | 3000 | 3050 | 110 | 1 |

It is seen from Table 1 that the white light emitting devices (the LED lamps) according to the examples maintain high luminance equal to or higher than 120 mcd and suppress a fall in luminance even under a high-temperature environment.

On the other hand, a fall in luminance under the high-temperature environment is large in the white light emitting device not including the first resin layer as in Comparative example 1. In the white light emitting device in which the composition of the phosphor is outside the range as in Comparative example 2, luminance is not improved. In the white light emitting device having the thin first resin layer as in Comparative example 3, since a function of the first resin layer as a protective layer is insufficient, a luminance fall under the high-temperature environment is large. In the white light emitting device having the thick first resin layer as in Comparative example 4, although an effect of suppressing a fall in luminance is obtained, since a distance from the chip to the phosphor layer (the second resin layer) is too large, improvement of luminance cannot be performed.

According to comparison of Examples 9 to 13 and comparison of Examples 14 to 17, it is seen that an average particle diameter of the phosphor powder is desirably 30 μm to 80 μm.

INDUSTRIAL APPLICABILITY

The white light emitting device, the backlight, and the liquid crystal display device according to the present invention can be used as components of display devices of a portable communication apparatus, a personal computer peripheral apparatus, an OA apparatus, a home appliance, audio equipment, a vehicle such as an automobile, a signal light, a switch, a light source display plate for backlight, and the like.

The illuminating device according to the present invention can be used in, for example, a publicly-known lighting apparatus.

The invention claimed is:

1. A white light emitting device comprising:
   a blue light emitting diode chip that emits blue light having a light emission peak wavelength of 430 nm to 490 nm;
   a first resin layer that seals the blue light emitting diode chip and includes a cured product of silicone resin having substantially no phosphors included therein; and
   a second resin layer that covers the first resin layer and includes phosphor powder, which absorbs the blue light and emits light having a light emission peak wavelength of 500 nm to 570 nm, and a cured product of transparent resin, wherein
   the phosphor powder has a composition represented by the following Formula (1):

$$(Sr_{1-x-y}Ba_xEu_y)_2SiO_4 \qquad (1)$$

(in Formula (1), x and y satisfy a condition that $0.36 \leq x < 0.5$ and $0.05 < y < 0.3$,
   an average particle diameter of the phosphor powder is within a range of 30 μm to 80 μm,
   a content of the phosphor powder in the second resin layer is 20 weight % to 50 weight %, and
   the first resin layer has thickness within a range of 200 μm to 2000 μm, the thickness being a length of a portion present in the first resin layer in a segment connecting a center portion of a bottom surface of the blue light emitting diode chip and a surface of the second resin layer.

2. The white light emitting device according to claim 1, wherein the thickness of the first resin layer is within a range of 500 μm to 1000 μm.

3. The white light emitting device according to claim 1, wherein the second resin layer has a thickness within a range of 1000 μm to 5000 μm, the thickness being a length of a portion present in the second resin layer in a segment connecting the center portion of the bottom surface of the blue light emitting diode chip and the surface of the second resin layer.

4. The white light emitting device according to claim 1, wherein, in the phosphor powder, y in Formula (1) satisfies a condition that $0.1 < y < 0.15$.

5. The white light emitting device according to claim 1, wherein, in the phosphor powder, x and y in Formula (1) satisfy a condition that $0.36 \leq x \leq 0.45$ and $0.1 \leq y \leq 0.15$.

6. The white light emitting device according to claim 1, wherein, the blue light emitting diode chip has peak forward current equal to or larger than 100 mA.

7. A backlight, wherein the white light emitting device according to claim 1 is used as a light source.

8. A liquid crystal display device comprising the backlight according to claim 7.

9. An illuminating device, wherein the white light emitting device according to claim 1 is used as a light source.

* * * * *